FIELD-EFFECT TRANSISTOR CIRCUIT

Filed March 7, 1963 2 Sheets-Sheet 1

INVENTORS
LOUIS SICKLES II &
MAX E. MALCHOW
BY Eugene M. Whitacre
ATTORNEY

FIELD-EFFECT TRANSISTOR CIRCUIT

Filed March 7, 1963 2 Sheets-Sheet 2

INVENTORS,
LOUIS SICKLES II &
BY MAX E. MALCHOW
Eugene M. Whitacre
ATTORNEY

United States Patent Office 3,229,218
Patented Jan. 11, 1966

3,229,218
FIELD-EFFECT TRANSISTOR CIRCUIT
Louis Sickles II, Philadelphia, Pa., and Max E. Malchow, Camden, N.J., assignors to Radio Corporation of America, a corporation of Delaware
Filed Mar. 7, 1963, Ser. No. 263,605
9 Claims. (Cl. 330—29)

This invention relates in general to electrical circuits embodying semiconductor devices and more particularly to attenuator or switching circuits which include insulated-gate field-effect transistors.

It is known that transistors possess bi-directional conductivity characteristics, and it has been proposed that such transistors be used in shunt or series attenuator or switching circuits. In such circuits, a desired signal to be controlled is applied between the collector and emitter electrodes of the transistor, and a base drive voltage from a suitable control circuit determines the conductivity which the transistor presents in the signal circuit.

One problem with such circuits is that the base drive voltage, which may be large relative to the signal voltage, tends to contaminate the signal. The base drive voltage produces a drive current which flows between the base and one or both of the other electrodes, and this drive current is then introduced into the signal circuit to produce undesired contamination of the signal, i.e., the controlled signal includes components, such as a different direct current level or transients, which were not present before the signal was controlled.

It is an object of this invention to provide an improved low distortion switching circuit employing a field-effect semiconductor device.

It is another object of this invention to provide an improved switching circuit or signal attenuation control circuit in which the controlling signal does not contaminate the controlled signal.

It is a further object of this invention to provide an improved AGC (automatic gain control) circuit for an intermediate frequency amplifier which does not introduce transients in the amplifier circuit, and which provides the AGC without changing the operating point of the active elements of the amplifier circuit.

It is still a further object of this invention to provide an improved AGC system for an R.-F. amplifier in a signal receiver where the transmission efficiency of the amplifier is controlled without changing the operating point of the amplifier.

An electrical circuit embodying the invention comprises an insulated-gate field-effect semiconductor device. Such a device has first and second electrodes formed on a substrate of semiconductor material and a gate electrode insulated from the substrate. The first and second electrodes are connected to each other by a channel of conductivity controlled by the voltage between the gate and source electrodes.

The current path between the first and second electrodes of the field-effect semiconductor device is effectively connected in series or in parallel with a signal channel to be controlled. Circuit means are coupled to the gate electrode for applying a control voltage which varies the conductivity of the current path between the first and second electrodes whereby the translation of the signal varies as a function of the amplitude and polarity of the control voltage. Since a very high impedance exists between the gate electrode and the other electrodes, the control voltage applied to the gate electrode does not produce a flow of current from the gate electrode to either one of the other electrodes but controls the conductivity of the current path between the first and second electrodes without introducing unwanted additional current in the signal channel.

Another circuit embodying the invention employs first and second insulated-gate field-effect transistors to control the amplitude of a signal voltage to be applied to a utilization circuit. The utilization circuit is effectively connected in parallel with the source-to-drain current path of one of the field-effect transistors and in series with the source-to-drain current path of the other one of the transistors. Input signals are coupled to the utilization circuit through the source-to-drain current path of the transistor connected in series. Control voltages are applied simultaneously to the gate electrodes of the insulated-gate field-effect transistors to respectively control the conductivity of the source-to-drain current paths. The control voltage applied to the gate electrode of the series transistor causes the source-to-drain current path of the series transistor to present a relatively large impedance, and simultaneously the control voltage applied to the parallel transistor causes the source-to-drain current path of the parallel transistor to present a relatively small impedance, and vice versa; so that in the first instance the amplitude of the signal applied to the utilization circuit is relatively low and in the second instance is relatively large. Because there is no current flow through the gate electrode, the control voltage does not contaminate the desired signal applied to the utilization circuit.

The novel features which are considered characteristic of the invention are set forth with particularity in the appended claims. The invention itself, however, both as to its organization and method of operation as well as additional objects and advantages thereof will best be understood from the accompanying drawing in which;

Figure 1:
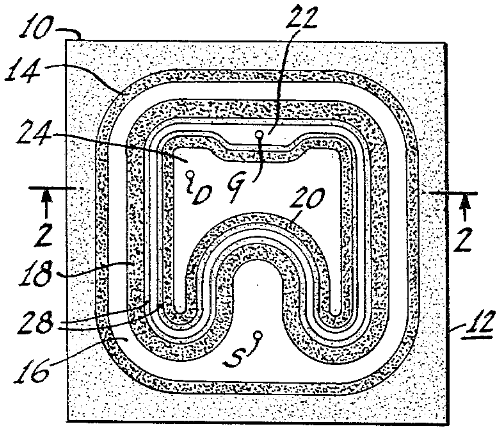
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example lightly doped P-type silicon of 100 ohm cm. material.

In the manufacture of a device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figures 2, 3:
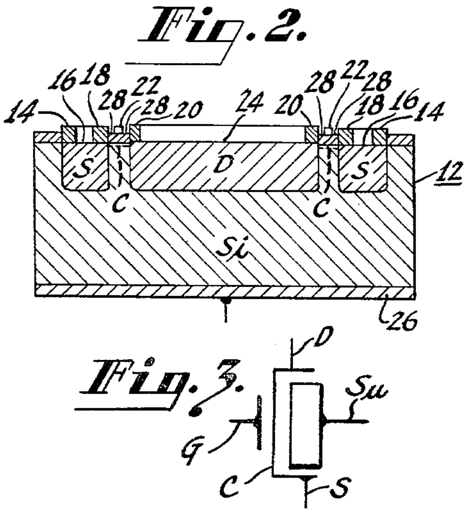
FIGURE 2 is a cross section view taken along section line 2—2 of FIGURE 1.
FIGURE 3 is a symbol representation of an insulated-gate field-effect transistor.

The body 12 is then heated in a suitable atmosphere such as in water vapor so that exposed silicon areas are oxidized to form grown silicon dioxide layers indicated by the stippled areas of FIGURE 1. During the heating process, impurities from the deposited silicon dioxide layer diffuse into silicon body 12 to form the source and drain regions. FIGURE 2, which is a cross section view taken along section line 2—2 of FIGURE 1, shows the source-drain regions labelled S and D respectively.

By means of another photo-resist and acid etching or like step the deposited silicon dioxide over part of the source-drain diffused regions are removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the stippled area between the outside boundary and the first more darkly stippled zone 14 is grown silicon dioxide. The white area 16 is the metal electrode corresponding to the source electrode. Dark zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2. The input resistance of the device at low frequencies is of the order of $10^{14}$ ohms. The layer of grown silicon dioxide 28 on which the gate electrode 22 is mounted, overlies an inversion layer or channel C connecting the source and drain regions. The gate electrode 22 is displaced symmetrically between the source region S and the drain region D. If desired, the gate electrode 22 may be displaced towards the source region S and may overlap the deposited silicon dioxide layer 18.

FIGURE 3 is a symbolic representation of the insulated-gate field-effect transistor previously described in FIGURES 1 and 2. There is shown the gate electrode G, the drain electrode D, the source electrode S, and the substrate of semiconductor material $S_u$. It should be noted that electrodes D and S operate as the drain and the source electrodes as a function of the polarity of the bias potential applied therebetween; i.e., the electrode to which a positive bias potential is applied (relative to the bias potential applied to the other electrode) operates as a drain electrode.

The drain and source electrodes are connected to each other by a channel C. The electrons flow from source to drain in this thin channel region close to the surface. The conductive channel C is shown in FIGURE 2 in dotted lines.

If the device has an N-type substrate, and P-type source and drain regions, the majority carriers are holes, and the electrode to which the negative terminal of a supply source is applied operates as the drain electrode.

Figure 4:
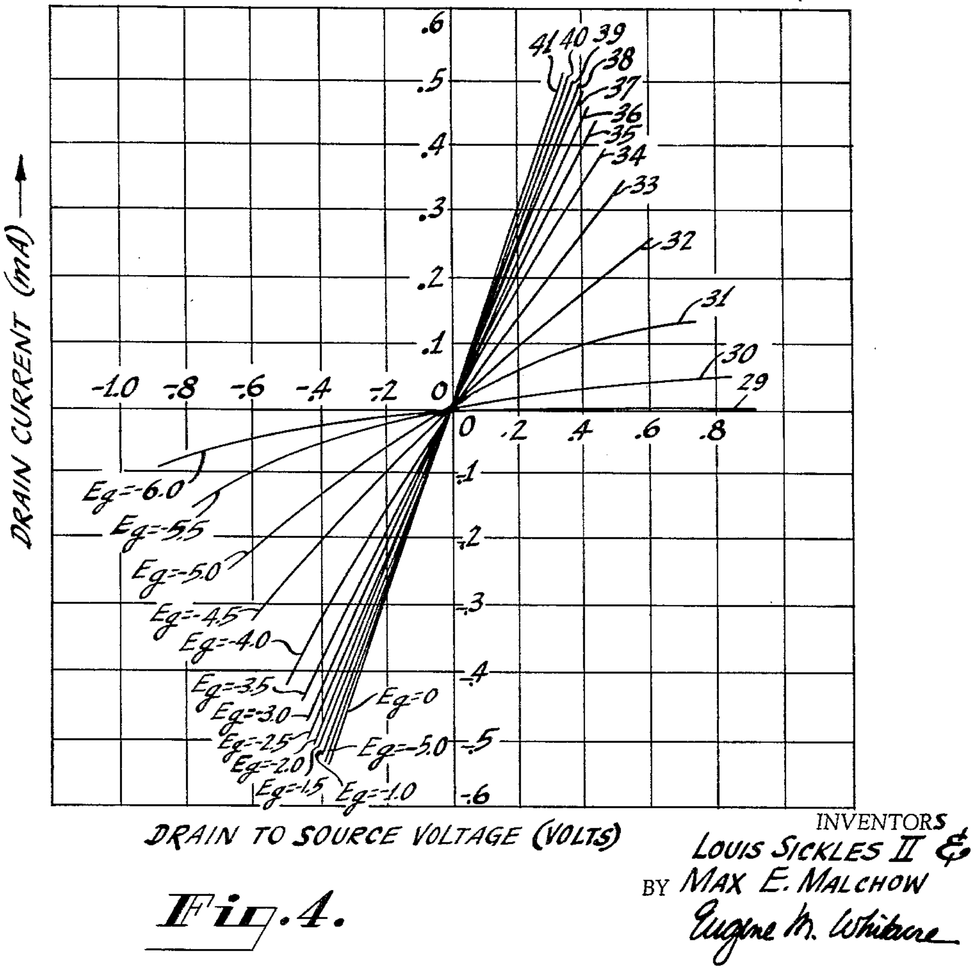
FIGURE 4 is a graph showing a family of drain current versus source-to-drain voltage curves for various values of gate-to-source voltages for the transistor of FIGURE 1.

The channel C, i.e., the source-to-drain current path, has controllable conductivity as shown by FIGURE 4 of the drawing. The conductivity of the channel C is a function of the amplitude and polarity of the gate-to-source bias voltage applied.

FIGURE 4 is a family of curves 29–41 illustrating the linear portion below the knee of the drain current versus drain voltage characteristic of the insulated-gate field-effect transistor shown in FIGURE 1, for different values of gate-to-ground bias voltage. As previously explained, the term "drain electrode" is used to refer to the electrode to which a positive bias voltage is applied, and the term "source electrode" is used to refer to the electrode to which a negative bias (with respect to the other electrode) is applied.

In order to more easily explain the conditions for obtaining the curves shown in FIGURE 4, one of the two electrodes will always be referred to as the drain electrode regardless of the polarity of the bias voltage applied thereto, and the other electrode will be referred to as the source electrode. The portion of the curves 29–41 shown in the first quadrant in FIGURE 4 were obtained by applying a bias potential to the drain electrode which is positive with respect to the potential of the source electrode, and by biasing the gate electrode with respect to the source electrode by a voltage having a magnitude as indicated by the dimension of $E_g$ (gate voltage) corresponding to each of the curves 29–41. The portion of the curves 29–41 corresponding to the third quadrant were obtained by reversing the polarity of the bias voltage applied between the source and drain electrodes, i.e., by applying a bias potential to the drain electrode which is negative with respect to the potential of the source electrode.

It should be noted that the portion of the drain current versus drain voltage characteristics shown in FIGURE 4 is substantially linear. This permits the insulated-gate field-effect transistor to operate as a resistance which varies in magnitude as a function of the gate-to-source bias voltage applied. The transistor may be operated with no direct current bias voltage between the source and drain electrodes, for example, and by applying an alternating current signal across the conductive channel the variation of the current flowing through the conductive channel will follow the path of the curve of curves 29–41 selected by the magnitude of the gate-to-ground bias voltage being applied.

A feature of an insulated-gate field-effect transistor is that the zero bias characteristic can be at any of the curves shown in FIGURE 4. In FIGURE 4, for example, the curve 41 corresponds to the zero bias voltage curve, as indicated by the notation $E_g=0$.

The location of the zero bias curve is selected during the manufacture of the transistor, i.e., by controlling the time and/or temperature of the step of the process when the silicon dioxide layer 28 shown in FIGURES 1 and 2 is grown. The longer the transistor is baked and the higher the temperature, in a dry oxygen atmosphere, the larger the drain current will be for a given amount of drain voltage at zero bias between the source and gate electrodes.

Figure 5:
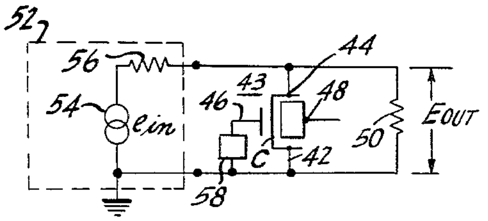
FIGURE 5 is a schematic circuit diagram of a switching circuit embodying the invention.

Reference is now made to FIGURE 5 which is a schematic diagram of a switching circuit employing an insulated-gate field-effect transistor 43 similar to the one described in FIGURES 1 and 2. The transistor 43 has a source electrode 42, a drain electrode 44, a gate electrode 46 and a substrate of semiconductor material 48. The source electrode 42 is connected to a point of reference potential shown as ground. The drain electrode 44 is connected to a load represented by a resistor 50, which load may be the input impedance of an A.-F. amplifier for example. A source of input signals 52, which is shown as a signal generator 54 having an internal impedance 56 is coupled across the load resistor 50, and is effectively connected across the channel C of controllable conductivity of the field-effect transistor 43. A control voltage source 58 is connected between the gate electrode 46 and ground. Channel C of controllable conductivity or the source-to-drain current path exhibits a resistance that is a function of the gate-to-source bias voltage and which is linear for certain values of source-to-drain voltage as shown in FIGURE 4.

In operation, as the input signals from the signal source 52 are applied, the load resistor 50 will receive a portion of the input signal as a function of the resistance exhibited by the source-to-drain current path of the field-effect transistor 43. If the gate-to-source bias voltage is such that the transistor 43 tends to cut off (more negative in the case of the transistor having the drain current versus drain voltage characteristic shown in FIGURE 4) the source-to-drain current path exhibits a large impedance whereby most of the input signal is applied to the load resistor 50. When, however, the gate-to-source bias voltage is positive, the source-to-drain current path exhibits a relatively small resistance shunting most of the input signals, so that the load resistor 50 receives a relatively small portion of the input signal.

The drain-to-source dynamic resistance, as a function of the gate bias, is found to vary from approximately 500 ohms to several hundred thousand ohms. As shown in FIGURE 4 the field-effect transistor can be used as a variable resistance with no external direct current bias of the source or the drain electrodes. In this case the transistor would be operating about the zero source-to-drain voltage point, as indicated in FIGURE 4, and the voltage swing across the transistor would result in excursions along the characteristic selected by the gate voltage applied thereto. This results in a control of signal level across the drain-to-source terminals which is achieved without introducing any of the control voltage from the source 58 into the utilization circuit. The circuit of FIGURE 5 may be used as a shunt attenuator, such as for AGC purposes, or as a switching circuit. Since the gate input impedance is intrinsically high, as previously mentioned, and the capacitance between the electrodes is relatively low the circuit may be operated efficiently as a high frequency switch.

It should be noted that because no D.-C. voltage is required between source and drain, the response of the signal control circuit (attack time) may be quite rapid (in the order of a microsecond) and it allows the signal control circuit to follow the control signal (such as AGC) more accurately.

Because of the advantages previously discussed the circuit shown in FIGURE 5 may be incorporated in circuits such as remote electronic volume control, signal compression and expansion and video switching, for example.

Figure 6:
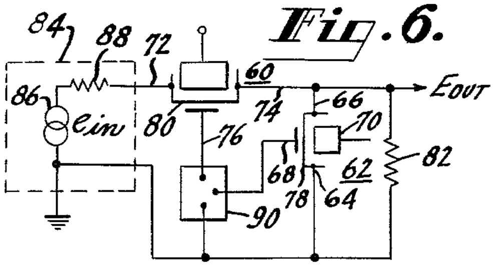
FIGURE 6 is a schematic circuit diagram of another switching circuit embodying the invention.

FIGURE 6 of the drawing is a schematic diagram of a switching network comprising field-effect transistors 60 and 62, which are similar to the field-effect transistor described in FIGURES 1, 2 and 3. The transistor 62 comprises source, drain and gate electrodes 64, 66 and 68, respectively, and a substrate 70. The transistor 60 includes drain, source and gate electrodes 72, 74 and 76 respectively. The source and drain electrodes 64 and 66 of the transistor 70 are connected through channel 78 of controllable conductivity (source-to-drain current path) and the drain and source electrodes 72 and 74 of the transistor 60 are connected to each other by a like channel 80. A load resistor 82, which represents the input impedance of a utilization circuit, such as an A.-F. amplifier, for instance, is effectively coupled across the conductive channel 78 of the transistor 62. The conductive channel 80 of the transistor 60 is effectively connected in series with the parallel circuit comprising the load resistor 82 and the conductive channel 78 of transistor 62.

Input signals from a signal source 84, which includes a signal source 86 having an internal impedance 88, are applied between the drain electrode 72 of the transistor 60 and a point of reference potential, shown as ground. A control voltage source 90 which may be any suitable source of direct current voltage, such as a battery with variable output voltage, or a source of train pulses, or an AGC detector, is respectively connected between the gate electrodes 76 and 68 of the transistors 60 and 62 and ground, to provide control voltages to the transistors 60 and 62 respectively.

The control voltages from the control voltage source 90 applied to the field-effect transistors 60 and 62 are such that when the control voltage applied to the gate electrode 76 causes the source-to-drain current path of the field-effect transistor 60 to exhibit a large resistance, the control voltage applied to the gate electrode 68 causes the drain-to-source current path of the field-effect transistor 62 to exhibit a small resistance simultaneously; and vice versa.

In operation, the load resistor 82 receives a portion of the input signals applied as a function of the resistances exhibited by the channels of controllable conductivity 80 and 78, respectively. It is to be understood that electrodes 72, 66 and 74, 64 are respectively identified as drain and source electrodes only as a matter of convenience, but in operation electrodes 64, 66, 72 and 74 may be either drain or source electrodes depending on the polarity of the potential of one with respect to the other electrode of the transistor, as previously explained. Due to this complementary type action a much higher on-to-off ratio signal control is achieved in comparison with the signal control obtained with the circuit shown in FIGURE 5. The circuit shown in FIGURE 6 may have the same applications as the circuit shown in FIGURE 5.

It should be noted that the field-effect transistor 60 could be used as the sole switching control of the signals from the input signal source 84. The control voltage applied to the gate electrode 76 causes the source-to-drain current path of the field-effect transistor 60 to exhibit a resistance that is either substantially larger or smaller than the resistance of the resistor 82 whereby the transistor 60 operates as a switch. If the control voltage consists of a series of synchronized pulses of desired amplitude and polarity a signal voltage is developed across the resistor 82 only at the desired times whereby transistor 60 would operate as a synchronous detector.

It is to be understood that when the insulated-gate field-effect transistors 48, 60 and 62 shown in FIGURES 5 and 6 are used as electronic switches the control voltages respectively applied to the gate electrodes should be of an amplitude that is large with respect to the amplitude of the signal to be controlled. The amplitude of the input signal is limited by the intrinsic characteristics of the field-effect transistors as evidenced by the drain current versus drain-to-source voltage characteristics shown in FIGURE 4. In order for the field-effect transistor to operate as a voltage controlled variable resistance the amplitude of the input signal should not drive the field-effect transistor into the region above the knee of the drain current versus drain voltage curve.

In addition, it should be noted that because the input signal constitutes the source-to-drain voltage and at the same time provides a source-to-gate bias during the negative half cycle of the input signal, the field-effect transistor operates at a different gate-to-source bias than the gate-to-source bias applied during the positive half cycle of the input signal. However, the amount of distortion due to a change of operating bias by the signal is very small when the amplitude of the input signals is limited to values which cause the transistor to operate below the knee of the drain current versus drain voltage curve.

Figure 7:
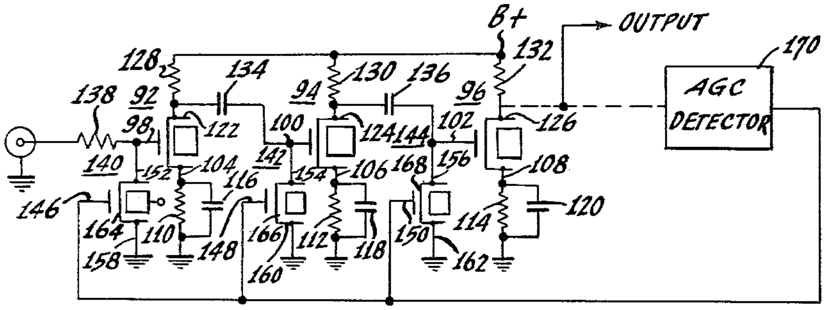
FIGURE 7 is a schematic circuit diagram of an I.-F. amplifier, with automatic gain control, embodying the invention.

Referring now to FIGURE 7, there is shown an I.-F. amplifier circuit comprising a plurality of amplifier stages. Three stages of amplification are shown, but it is to be understood that a larger or fewer number of stages may be included, as shown by the dotted line. The active elements of each of the amplifier stages are field-effect transistors 92, 94 and 96 which are similar to the field-effect transistor described in connection with FIGURES 1 and 2.

The transistor 92, which is the active element of the input stage of the I.-F. amplifier, receives input signals from an input signal source not shown. The signals are applied between the gate electrode 98 of the transistor 92 and ground through an input resistor 138 connected in series with the gate electrode 98. The transistors 92, 94 and 96 are self biased by means of resistors 110, 112 and 114 respectively connected between a point of reference potential, shown as ground, and the source electrodes 104, 106 and 108. The resistors 110, 112 and 114 are bypassed to ground by capacitors 116, 118 and 120 respectively. The drain electrodes 122, 124 and 126 of transistors 92, 94 and 96 respectively are coupled through resistors 128, 130 and 132 to a source of bias potential B+ (not shown), which may be a battery for example. Coupling capacitors 134 and 136 respectively couple the amplified signal from the drain electrodes 122 and 124 to the gate electrodes 100 and 102. The output signal from the last stage of the I.-F. amplifier (derived from the drain electrode of the transistor constituting the active element of the output stage) is coupled to an AGC detector 170 and to a utilization circuit (not shown).

The I.-F. amplifier shown in FIGURE 7 and the AGC detector may be respectively the I.-F. amplifier and the second detector of a radio receiver or of a television receiver, for example. The output voltage from the AGC detector is the control voltage and it is applied to the gate electrodes 146, 148 and 150 of field-effect transistors 140, 142 and 144, which are similar to the insulated-gate field-effect transistor shown in FIGURES 1 and 2. Insulated-gate field-effect transistors 140, 142 and 144 operate as voltage controlled variable resistance devices as described in connection with the circuit shown in FIGURE 5. The source-to-drain current paths 164, 166 and 168 of transistors 140, 142 and 144 are effectively coupled between the gate electrodes 98, 100 and 102 of transistors 92, 94 and 96, respectively, and ground.

The operation of each of the switching or voltage control networks shown in FIGURE 7 is the same as the operation described in connection with the circuit shown in FIGURE 5.

Since the insulated-gate field-effect transistors employed to control the gain of the amplifier have very high impedance between the gate electrode and the source and drain electrodes respectively, a change in the amplitude of the control signal does not produce flow of gate current and hence, transients or contamination of the desired signal are not introduced in the amplifier circuit resulting in transient and contamination free automatic gain control.

In addition the I.-F. amplifier shown in FIGURE 7 does not have the problem of intermodulation distortion. In most amplifier circuits using either transistors or vacuum tubes as the active elements of the circuit, the transfer characteristic of the amplifier is such that although the active elements are biased for linear operation, in order to control the gain of the amplifier circuit, the operating point is varied by changing the bias voltage between the input electrodes. The amplifier circuit then may be biased for certain values of AGC voltage in a non-linear region which produces intermodulation distortion. Intermodulation distortion is one of the effects of non-linearity when more than one input frequency is applied, such as the production of sum and difference frequencies, for example, which are the principal cause of distorted reproduction.

In the amplifier circuit shown in FIGURE 7, on the other hand, the problem of intermodulation distortion is substantially reduced because the amplifier's active elements are biased to an operating point in the linear region of their transfer characteristic. The control of the signal's amplitude is effected without changing the operating point so that the amplifier continues to operate in a linear region at the optimum designed operating point.

Figure 8:
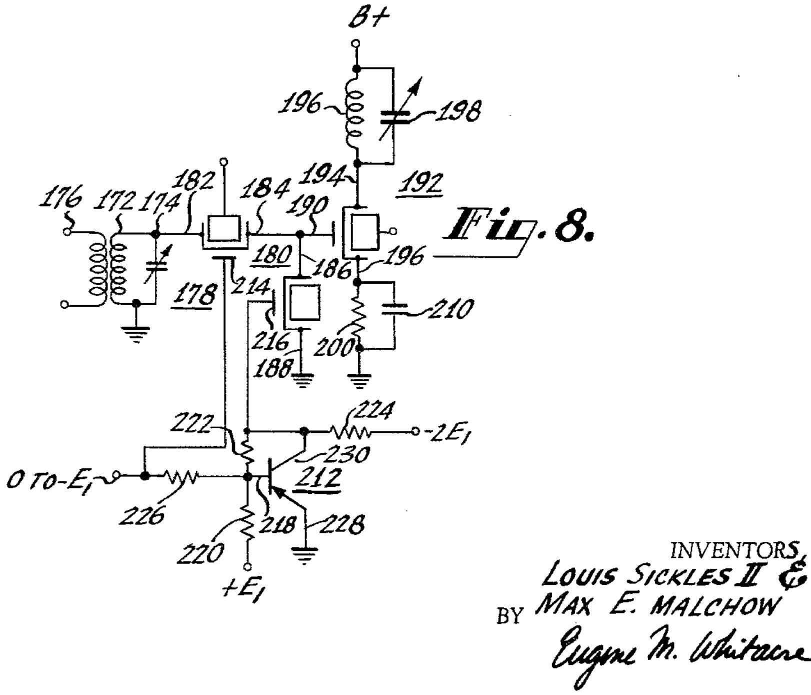
FIGURE 8 is a schematic circuit diagram of an R.-F. amplifier stage for a broadcast receiver embodying the invention.

Referring now to FIGURE 8 of the drawing there is shown an R.-F. amplifier stage for a broadcast receiver in which AGC is applied ahead of the first stage, and the operating point of the first stage is not changed as AGC voltage changes. Input signals from an antenna terminal which includes the primary winding 176 of a transformer are inductively coupled to an input circuit comprising an inductor 172, which is the secondary winding of the transformer, and a variable capacitor 174. The input circuit is connected between the drain electrode 182 of a field-effect transistor 178 and a point of reference potential shown as ground.

The field-effect transistor 178 together with a field-effect transistor 180 form a signal control circuit similar to the one shown in FIGURE 6. A field-effect transistor 192 constitutes the active element of the R.-F. amplifier. The source-to-drain current path of the field-effect transistor 180 is effectively connected in a parallel circuit with the input impedance of the R.-F. amplifier circuit, and the source-to-drain current path of the field-effect transistor 178 is effectively connected in series with the parallel circuit. Output signals from the R.-F. amplifier are derived from a tuned circuit including an inductor 196 and a variable capacitor 198. The inductor 196 and the capacitor 198 are connected between the drain electrode 194 of the field-effect transistor 192 and a source of bias potential B+ (not shown). The R.-F. amplifier stage is self-biased by means of a resistor 200 connected between the source electrode 196 and ground. The resistor 200 is bypassed to ground by a capacitor 210.

The resistance exhibited by the source-to-drain current paths of the field-effect transistors 178 and 180 are controlled by means of control voltages respectively applied to the gate electrodes 214 and 216 of the field-effect transistors 178 and 180, as explained in connection with the circuit shown in FIGURE 6.

A circuit which includes a PNP transistor 212, is coupled to the gate electrodes 214 and 216 for applying control signals to the gate electrodes 214 and 216 of the field-effect transistors 178 and 180. An AGC voltage having an amplitude that varies between zero and $-E_1$ volts is applied through an input resistor 226 to the base electrode 218 of the transistor 212. The AGC voltage is also directly applied to the gate electrode 214 of the field-effect transistor 178. The collector electrode 230 of the transistor 212 is connected to a source of bias potential $-2E_1$ (not shown) through a resistor 224. The resistor 224, the resistor 222 and the resistor 220 are connected as a voltage divider network between a source of bias potential $+E_1$ and the source of bias potential $-2E_1$ so that the voltage derived at the collector electrode 230 of the transistor 212 is a function of the amplitude of the AGC voltage; for example when the AGC voltage is zero, the voltage derived from the drain electrode 230 is $-E_1$, and when the AGC voltage is $-E_1$ the voltage derived from the collector electrode 230 is zero.

The voltage derived from the collector electrode 230 is coupled to the gate electrode 216 to control the conductivity of the source-to-drain current path of the field-effect transistor 180. In operation, when the AGC voltage is zero volts, the resistance of the source-to-drain current path of field-effect transistor 178 is relatively small, and simultaneously the control voltage derived from the transistor 212 is $-E_1$ volts which causes the resistance presented by the source-to-drain current path of the transistor 180 to be relatively large. Conversely, when the AGC voltage is $-E_1$ volts the resistance exhibited by the source-to-drain current path of the field-effect transistor 178 is very large, and the resistance exhibited by the source-to-drain current path of transistor 180 is very small. The combined action of field-effect transistors 178 and 180 provides the radio frequency amplifier circuit with signal control which is substantially free of: (1) transient distortion and (2) added D.-C. level in the output signal.

In addition, the circuit shown in FIGURE 8 has the advantage of having no change in selectivity due to the AGC. As the AGC level changes and the resistance exhibited by each of the source-to-drain current paths of transistors 178 and 180 varies, the effective loading of the input circuit remains substantially constant. This substantially constant loading is due to the complementary type action of the source-to-drain current paths of the transistors 178 and 180, i.e., when the source-to-drain current path of transistor 178 exhibits a small impedance, the source-to-drain current path of transistor 180 exhibits a large impedance, and vice versa, so that approximately the same impedance loads the tuned input circuit at all times.

We claim:

1. An electrical circuit comprising:

first and second field-effect semiconductor devices each having first and second electrodes, a gate electrode insulated from said first and second electrodes, and including a channel of variable conductivity between said first and second electrodes that varies as a function of the bias voltage applied to said gate electrode, the channel of said first field-effect semiconductor device exhibiting a substantially bidirectionally linear resistance for a range of voltages applied thereto, an output circuit and a source of energizing potential effectively connected to form a translating circuit with said conductive channel of said second semiconductor device, circuit means coupling said first and second electrodes of said first field-effect semiconductor device across the gate electrode and one of said first and second electrodes of said second semiconductor device, input circuit means coupled across the first and second electrodes of said first field-effect semiconductor device for applying input signals across said first and second electrodes of said first field-effect semiconductor device and across said gate electrode and said one of said first and second electrodes of said second field-effect semiconductor device, and means connected between said gate electrode and one of said first and second electrodes of said first field-effect semiconductor device for applying a control signal voltage to control the impedance presented by said conductive channel of said first field-effect semiconductor device whereby the amplitude of the voltage applied across the gate electrode and one of said first and second electrodes of said second field-effect semiconductor device and the voltage derived from the output circuit varies as a function of the amplitude of said control signal voltage.

2. In combination, first and second insulated-gate field-effect transistors each having source and drain electrodes formed on a substrate of semiconductor material and a gate electrode insulated from said substrate, said drain and source electrodes of each transistor being electrically connected by a conductive channel, the conductive channel of said first transistor exhibiting a substantially bidirectionally linear resistance for a range of voltages applied thereto, circuit means coupling the drain and source electrodes of said first transistor between the gate and source electrodes of said second transistor, input circuit means coupled across said drain and source electrodes of said first transistor for applying input signals across its conductive channel and across the gate and source electrodes of said second transistor, output circuit means connected across said source and drain electrodes of said second transistor for deriving output signals, said output circuit means being adapted to be connected to a source of energizing potential, and control circuit means connected between said gate and said source electrodes of said first transistor for applying a control signal voltage which varies the impedance presented by said conductive channel of said first transistor whereby the output signal derived from said output circuit means is a function of the amplitude of said control signal voltage.

3. An electronic switching circuit comprising, first and second field-effect transistors each comprising drain and source electrodes formed on a substrate of semiconductor material and a gate electrode insulated from said substrate, said drain and source electrodes being connected to each other by a channel of controllable conductivity, means connecting said channels of controllable conductivity in series, means including a load connected across the channel of controllable conductivity of one of said first and second transistors, means effectively coupled across said first and second transistors for applying input signals, and circuit means for applying control signal voltages to said gate electrodes of said first and second transistors, said control voltages having a predetermined value and polarity such that when one of said channels is caused to be in a high conductivity state the other is caused to be in a low conductivity state, and vice versa.

4. In combination, an alternating current signal source, an electronic switch for controlling the amplitude of said alternating current signal applied to a load connected thereto comprising, first and second field-effect transistors connected in series to each other, each of said field-effect transistors having drain and source electrodes formed on a substrate of semiconductor material and having a gate electrode insulated from said substrate, said drain and source electrodes being connected to each other by a conductive channel, said conductive channel presenting a variable impedance as a function of the gate-to-source bias voltage applied thereto, and circuit means for simultaneously applying signal voltages complementary to each other respectively to said gate electrodes of said first and second field-effect transistors to simultaneously control the impedance exhibited by said conductive channels, whereby when one of said first and second field-effect transistors presents a low impedance the other of said first and second transistors presents a relatively large impedance and input signals are applied to said load, and when said one of said first and second field-effect transistors presents a relatively small impedance said other field-effect transistor presents a large impedance and substantially no signals are applied to said load.

5. In combination with an R.-F. amplifier circuit including a first field-effect transistor having gate, source and drain electrodes and having a substrate of semiconductor material, said amplifier circuit comprising a tunable output circuit coupled to said drain electrode, means to self-bias said field-effect transistor including a resistor connected between said source electrode and a point of reference potential, a tunable input circuit coupled between said gate electrode and said point of reference potential for receiving input signals from an antenna terminal, a signal control circuit including second and third field-effect transistors having drain and source electrodes formed on a substrate of semiconductor material and having gate electrodes insulated from said substrate, means for connecting said second and third field-effect transistors in series to each other between said tunable input circuit and said point of reference potential, means for coupling said third field-effect transistor between said gate and source electrodes of said first field-effect transistor, a transistor having collector, base and emitter electrodes, means coupled between said collector electrode and said emitter electrode of said transistor for deriving a signal having a predetermined amplitude and polarity from said collector electrode, means coupled between said base and emitter electrodes of said transistor for applying AGC input signals, and circuit means respectively connecting said AGC signals to the gate electrode of one of said first and second field-effect transistors and said output signals from said collector electrode to the other of said gate electrodes of said first and second field-effect transistors to control the resistance exhibited by the conductive channels of said first and second field-effect transistors so that when said first field-effect transistor exhibits a large resistance said second field-effect transistor exhibits a small resistance, and vice versa.

6. A tuned amplifier circuit comprising, an input circuit including reactive circuit means selected to exhibit a predetermined amplitude versus frequency characteristics, an active device including input, output and common electrodes, means for biasing said active device for operation in the linear region of its signal transfer characteristic, an output circuit for said amplifier coupled between said output and common electrodes of said active device, means coupling said input circuit between the input and common electrodes of said active device comprising first and second insulated-gate field-effect transistors each having source, drain and gate electrodes formed on a substrate of semiconductor material, and having a drain current versus source-to-drain voltage characteristic that is linear for some values of source-to-drain voltages and which varies as a function of the gate-to-source voltage applied thereto, the source-to-drain path of said first field-effect transistor being connected between the input and common electrodes of said active device and the source-to-drain current path of said second field-effect transistor being connected in series between said input circuit and the input electrode of said active device, means for developing a control voltage that is a function of the signal amplitude applied to said input circuit, circuit means for applying said control voltage to the gate electrodes of said first and second field-effect transistors of a polarity and amplitude such that the source-to-drain conductivity of said first field-effect transistor increases and the source-to-drain conductivity of said second field-effect transistor decreases as the signal amplitude applied to said input circuit increases, whereby the transmission efficiency for signals between said input circuit and said output circuit is controlled as a function of signal level without changing the operating point of said amplifier and without substantial changes in the load of said input circuit.

7. An amplifying system comprising: first and second field-effect transistors each having source and drain electrodes with a channel of variable conductivity between said drain and source electrodes and a gate electrode for controlling the conductivity of said channel formed on a substrate of semiconductor material, said first field-effect transistor having a signal transfer characteristic including a linear operating region said second field-effect transistor channel exhibiting a substantially linear bidirectional current conduction characteristic for a range of voltage applied across its drain and source electrodes, circuit means connected between said source electrode of said first field-effect transistor and a point of reference potential for self-biasing said first field-effect transistor in the linear region of its signal transfer characteristic, circuit means adapted to be connected to a source of energizing potential coupled to said drain electrode of said first field-effect transistor for deriving an output signal, circuit means coupled between said gate and source electrodes of said first field-effect transistor for applying input signals to said amplifier circuit within said range of voltages, detector circuit means coupled to said drain electrode of said first field-effect transistor for detecting the output signal from said first field-effect transistor, control voltage circuit means including said second field-effect transistor having said source and drain electrodes connected between said gate electrode of said first field-effect transistor and said point of reference potential for controlling the amplitude of said input signals, and circuit means coupled between said gate electrode of said second field-effect transistor and said detector circuit for applying said detected output signal to said second field-effect transistor whereby the channel of controllable conductivity of said second field-effect transistor exhibits a variable resistance as a function of the amplitude of the output signal controlling the gain of said amplifier circuit without changing the operating point of said first field-effect transistor.

8. An amplifying system comprising:

first and second insulated gate field-effect transistors each having first and second electrodes and a gate electrode insulated from said first and second electrodes, and having a semiconductor channel between said first and second electrodes of a conductivity that varies as a function of the bias voltage applied to said gate electrode, the channel of said first field-effect transistor exhibiting a substantially linear bi-directional current condition characteristic for a range of voltages applied across said first and second electrodes, circuit means including an output circuit adapted to be connected to a source of energizing potential connected across said first and second electrodes of said second field-effect transistor and including a self-biasing circuit for biasing said second field-effect transistor for Class A operation as an amplifier circuit having a predetermined gain, circuit means connecting the first and second electrodes of said first field-effect transistor between said gate and said biasing circuit of said second field-effect transistor whereby the semiconductor channel of said first field-effect transistor acts as a gate resistor for said second field-effect transistor amplifier circuit, input circuit means coupled across the first and second electrodes of said first field-effect transistor for applying input signals within said range of voltages, said input circuit means having an internal impedance, and means connected between said gate electrode and one of said first and second electrodes of said first field-effect transistor for applying a control voltage to control the impedance presented by its channel so that the amplitude of signal voltage developed by said output circuit varies as a function of the amplitude of the control voltage thereby controlling the gain of the amplifying system without changing the Class A operation point of said second field-effect transistor.

9. An electronic switching circuit comprising:

a first and second field-effect transistors each having a first and second electrodes, and each having a gate electrode insulated from said first and second electrodes and each having a semiconductor channel of a conductivity that varies as a function of the bias voltage applied to the gate electrode between said first and second electrodes, said channels exhibiting a substantially linear bi-directional current conduction characteristic for range voltages applied across said respective first and second electrodes, means connecting said channels of controllable conductivity in series, means including a load connected across the channel of controllable conductivity of one of said first and second transistors, means effectively coupled across both of said channels of controllable conductivity, said first and second transistors for applying input signals within said range of voltages, and circuit means for applying control signal voltages to said gate electrodes of said first and second transistor, said control electrodes having predetermined value and a polarity such that when one of said channels is caused to be in a high conductivity state the other is caused to be in a low conductivity state, and vice versa.

References Cited by the Examiner

UNITED STATES PATENTS

| | | | |
|---|---|---|---|
| 2,021,920 | 11/1935 | Norwine | 330—145 X |
| 2,879,344 | 3/1959 | Chatterton | 330—29 X |
| 2,939,916 | 6/1960 | Miller | 307—88.5 |
| 3,056,888 | 10/1962 | Atalla | 307—88.5 |
| 3,117,287 | 1/1964 | Damico | 330—29 X |

OTHER REFERENCES

Electronic Engineering, August 1957, article by Burton: "A Transistor D.C. Chopper Amplifier," pp. 393–397.

Semiconductor Products, February 1961, article by W. S. Massey: "A Review of the Transistor Chopper," pp. 42–46.

ROY LAKE, *Primary Examiner.*